(12) United States Patent
Magro et al.

(10) Patent No.: US 12,253,961 B2
(45) Date of Patent: Mar. 18, 2025

(54) STAGING MEMORY ACCESS REQUESTS

(71) Applicant: ADVANCED MICRO DEVICES, INC., Santa Clara, CA (US)

(72) Inventors: James R. Magro, Austin, TX (US); Kedarnath Balakrishnan, Bangalore (IN); Ravindra N. Bhargava, Austin, TX (US); Guanhao Shen, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 10 days.

(21) Appl. No.: 16/728,114

(22) Filed: Dec. 27, 2019

(65) Prior Publication Data

US 2021/0200695 A1 Jul. 1, 2021

(51) Int. Cl.
*G06F 13/16* (2006.01)
*G06F 12/1009* (2016.01)
*G11C 8/12* (2006.01)
*G11C 11/406* (2006.01)

(52) U.S. Cl.
CPC ...... *G06F 13/1631* (2013.01); *G06F 12/1009* (2013.01); *G06F 13/1642* (2013.01); *G11C 8/12* (2013.01); *G11C 11/406* (2013.01); *G06F 2212/1016* (2013.01)

(58) Field of Classification Search
CPC .............. G06F 13/1631; G06F 12/1009; G06F 13/1642; G06F 2212/1016; G11C 11/406; G11C 8/12
USPC ......................................................... 711/105
See application file for complete search history.

(56) References Cited

U.S. PATENT DOCUMENTS

| 4,394,732 | A  | * | 7/1983  | Swenson    | G06F 12/0866 |
|           |    |   |         |            | 711/113      |
| 6,449,666 | B2 | * | 9/2002  | Noeldner   | G06F 13/28   |
|           |    |   |         |            | 710/22       |
| 6,496,516 | B1 | * | 12/2002 | Dabecki    | H04L 47/30   |
|           |    |   |         |            | 370/413      |
| 9,164,772 | B2 | * | 10/2015 | Dockser    | G06F 9/3836  |
| 9,639,280 | B2 | * | 5/2017  | Roberts    | G06F 3/0611  |
| 10,146,434 | B1 | * | 12/2018 | Bromberg  | G06F 3/0656  |
| 10,275,352 | B1 | * | 4/2019  | Balakrishnan | G11C 16/0408 |
| 10,275,371 | B2 | * | 4/2019  | Lee        | G06F 13/1673 |
| 10,318,210 | B2 | * | 6/2019  | Ishii      | G11C 29/42   |
| 10,534,565 | B1 | * | 1/2020  | Banerjee   | G11C 11/4076 |
| 10,969,996 | B1 | * | 4/2021  | Noiman     | G06F 3/0659  |
| 10,990,321 | B2 | * | 4/2021  | La Fratta  | G06F 3/0604  |
| 2003/0217244 | A1 | * | 11/2003 | Kelly    | G06F 13/1684 |
|           |    |   |         |            | 711/168      |

(Continued)

FOREIGN PATENT DOCUMENTS

| EP | 3270294 A1 | 1/2018 |
| EP | 3270296 A1 | 1/2018 |
| JP | 2006164099 A | 6/2006 |

OTHER PUBLICATIONS

International Search Report and Written Opinion, PCT/US2020/066618, Mar. 25, 2021, 9 pages.

*Primary Examiner* — Reginald G Bragdon
*Assistant Examiner* — Aaron D Ho

(57) ABSTRACT

Staging memory access requests includes receiving a memory access request directed to Dynamic Random Access Memory; storing the memory access request in a staging buffer; and moving the memory access request from the staging buffer to a command queue.

18 Claims, 13 Drawing Sheets

(56) References Cited

U.S. PATENT DOCUMENTS

| | | | |
|---|---|---|---|
| 2005/0246481 A1* | 11/2005 | Rohit | G06F 13/161 |
| | | | 711/105 |
| 2006/0112240 A1* | 5/2006 | Walker | G06F 13/1631 |
| | | | 711/154 |
| 2006/0294264 A1* | 12/2006 | Akiyama | G06F 13/1626 |
| | | | 710/42 |
| 2007/0016699 A1* | 1/2007 | Minami | G06F 13/1626 |
| | | | 710/20 |
| 2011/0040923 A1* | 2/2011 | Ren | H04L 49/9073 |
| | | | 711/138 |
| 2011/0072172 A1* | 3/2011 | Rodrigues | G06F 13/385 |
| | | | 710/52 |
| 2011/0258353 A1* | 10/2011 | Wang | G06F 13/1642 |
| | | | 710/110 |
| 2015/0220274 A1* | 8/2015 | Lin | G06F 3/0688 |
| | | | 711/103 |
| 2015/0242307 A1* | 8/2015 | Busaba | G06F 9/528 |
| | | | 711/165 |
| 2015/0310578 A1* | 10/2015 | You | G06T 1/60 |
| | | | 345/547 |
| 2016/0110286 A1* | 4/2016 | Xia | G06F 12/0804 |
| | | | 711/122 |
| 2016/0139829 A1* | 5/2016 | Sanzone | G06F 8/4442 |
| | | | 711/122 |
| 2016/0301563 A1* | 10/2016 | Erdmann | H04L 1/1835 |
| 2017/0315914 A1* | 11/2017 | Muralimanohar | G06F 13/161 |
| 2017/0344309 A1* | 11/2017 | Balakrishnan | G06F 13/16 |
| 2017/0351438 A1* | 12/2017 | Lee | G06F 3/0679 |
| 2018/0018105 A1* | 1/2018 | Magro | G06F 13/287 |
| 2018/0018133 A1* | 1/2018 | Balakrishnan | G06F 3/0683 |
| 2018/0018291 A1* | 1/2018 | Magro | G06F 13/1689 |
| 2018/0188975 A1* | 7/2018 | Benisty | G06F 3/0679 |
| 2018/0275923 A1* | 9/2018 | Earhart | G06F 3/0604 |
| 2018/0349300 A1* | 12/2018 | Bubb | G06F 3/061 |
| 2018/0365167 A1* | 12/2018 | Eckert | G06F 12/1036 |
| 2019/0354472 A1* | 11/2019 | Jacob | G06F 12/0862 |

* cited by examiner

STAGING MEMORY ACCESS REQUESTS

BACKGROUND

Command queues store memory access requests prior to execution. Increased arbitration and storage pressure on the command queue results in a performance decrease.

DETAILED DESCRIPTION

Figure 1:
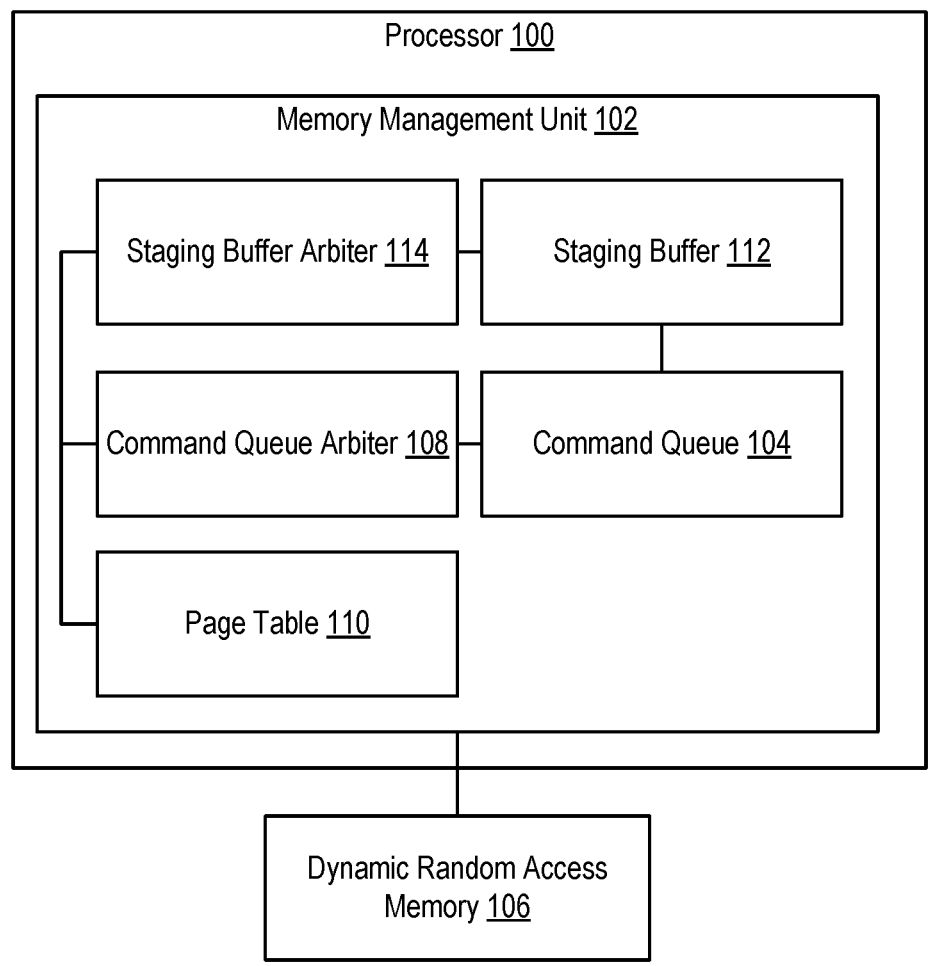
FIG. 1 is a block diagram of an example processor for staging memory access requests according to some embodiments.

In some embodiments, a method of staging memory access requests includes receiving a memory access request directed to Dynamic Random Access Memory; storing the memory access request in a staging buffer; and moving the memory access request from the staging buffer to a command queue.

In some embodiments, the method includes selecting the memory access request from the command queue; and executing the memory access request. In some embodiments, the method includes receiving another memory access request; determining that the staging buffer is full; and storing the other memory access request in the command queue without storing the other memory access request in the staging buffer. In some embodiments, the method includes selecting, based on one or more arbitration rules, the memory access request from a plurality of memory access requests in the staging buffer for moving to the command queue. In some embodiments, selecting, based on one or more arbitration rules, the memory access request includes selecting the memory access request based on one or more of an open Dynamic Random Access Memory page, a bank group rotation, a request type of the memory access request, or a sub-channel balancing.

In some embodiments, a memory management unit for staging memory access requests performs steps including: receiving a memory access request directed to Dynamic Random Access Memory; storing the memory access request in a staging buffer; and moving the memory access request from the staging buffer to a command queue.

In some embodiments, the steps include selecting the memory access request from the command queue; and executing the memory access request. In some embodiments, the steps include receiving another memory access request; determining that the staging buffer is full; and storing the other memory access request in the command queue without storing the other memory access request in the staging buffer. In some embodiments, the steps include selecting, based on one or more arbitration rules, the memory access request from a plurality of memory access requests in the staging buffer for moving to the command queue. In some embodiments, selecting, based on one or more arbitration rules, the memory access request includes selecting the memory access request based on one or more of an open Dynamic Random Access Memory page, a bank group rotation, a request type of the memory access request, or a sub-channel balancing.

In some embodiments, a processor for staging memory access requests includes a memory management unit to perform steps including: receiving a memory access request directed to Dynamic Random Access Memory; storing the memory access request in a staging buffer; and moving the memory access request from the staging buffer to a command queue.

In some embodiments, the steps include selecting the memory access request from the command queue; and executing the memory access request. In some embodiments, the steps include receiving another memory access request; determining that the staging buffer is full; and storing the other memory access request in the command queue without storing the other memory access request in the staging buffer. In some embodiments, the steps include selecting, based on one or more arbitration rules, the memory access request from a plurality of memory access requests in the staging buffer for moving to the command queue. In some embodiments, selecting, based on one or more arbitration rules, the memory access request includes selecting the memory access request based on one or more of an open Dynamic Random Access Memory page, a bank group rotation, a request type of the memory access request, or a sub-channel balancing.

In some embodiments, a system for staging memory access requests includes an apparatus including a processor, the processor including a memory management unit to perform steps including: receiving a memory access request directed to Dynamic Random Access Memory; storing the memory access request in a staging buffer; and moving the memory access request from the staging buffer, to a command queue.

In some embodiments, the steps include selecting the memory access request from the command queue; and executing the memory access request. In some embodiments, the steps include receiving another memory access request; determining that the staging buffer is full; and storing the other memory access request in the command queue without storing the other memory access request in the staging buffer. In some embodiments, the steps include selecting, based on one or more arbitration rules, the memory access request from a plurality of memory access requests in the staging buffer for moving to the command queue. In some embodiments, selecting, based on one or more arbitration rules, the memory access request includes selecting the memory access request based on one or more of an open Dynamic Random Access Memory page, a bank group rotation, a request type of the memory access request, or a sub-channel balancing.

FIG. 1 is a block diagram of a non-limiting example processor 100 according to some embodiments. The example processor 100 can be implemented in a variety of computing devices, including mobile devices, personal computers, peripheral hardware components, gaming devices, set-top boxes, and the like. The processor 100 includes a memory management unit 102. The memory management unit 102 receives memory access requests (e.g., requests to read and/or write data to a particular region of memory. The memory management unit 102 also performs the translation of virtual memory addresses in the memory access requests to physical memory addresses in order to perform the memory access request.

The memory management unit 102 includes a command queue 104. The command queue 104 stores memory access requests as they are received (e.g., from a central processing unit or other component of the processor 100) prior to execution to access Dynamic Random Access Memory 106. Although the Dynamic Random Access Memory 106 is shown as being separate from the processor 100, it is understood that the Dynamic Random Access Memory 106 may include on-chip Dynamic Random Access Memory 106 (e.g., as a component of the processor 100). Where the Dynamic Random Access Memory 106 includes multiple banks, the memory management unit 102 may include multiple command queues 104 each corresponding to a respective bank.

The memory management unit 102 selects memory access requests for execution from the command queue 104 using one or more schemes, such as first-come-first-served (FCFS), first-ready, first-come-first-served (FR-FCFS), first-in-first-out (FIFO), etc. The memory management unit 102 includes a command queue arbiter 108 that selects memory access requests from the command queue 104 for execution using one or more rules. For example, the one or more rules are based on timing or clock information (e.g., an age of a memory access request). As another example, the one or more rules are based on a page table 110. For example, memory access requests that will result in a page table 110 hit are preferentially selected from the command queue 104 for execution.

In existing approaches, memory access requests received by a memory management unit 102 are placed directly in a command queue 104 for subsequent execution. To improve performance and relieve pressure on the command queue 104, the memory management unit 102 includes a staging buffer 112. Memory access requests received by the memory management unit 102 are placed in the staging buffer 112. A staging buffer arbiter 114 then selects, based on one or more arbitration rules, memory access requests from the staging buffer 112 for movement to the command queue 104.

In some embodiments, the arbitration rules are based on a Dynamic Random Access Memory 106 page targeted by a memory access request. For example, a memory access request targeting a Dynamic Random Access Memory 106 page that is open is preferentially selected for movement to the command queue 104 as overhead required in closing and opening pages is reduced. As another example, a memory access request targeting a Dynamic Random Access Memory 106 page that is also targeted by another memory access request in the command queue 104, and therefore will be open when the selected memory access request is executed, is preferentially selected.

In some embodiments, the arbitration rules are based on a bank group rotation or rank rotation. For example, where the Dynamic Random Access Memory 106 includes multiple banks, memory access requests are selected from the staging buffer 112 for addition to the command queue 104 such that consecutively added requests do not target a same bank. As an example, a memory access request targeting a first bank is moved to the command queue 104, then a memory access request targeting a second bank is moved to the command queue 104. Another memory access request targeting the first bank is then be added to the command queue 104, etc. In some embodiments, memory access requests are selected to target different ranks within the same or different banks or to alternatively target different sub-channels of Dynamic Random Access Memory 106 (e.g., sub-channel balancing).

In some embodiments, the arbitration rules are based on a request type for the memory access requests (e.g., read or write). As there is computational overhead in switching between Dynamic Random Access Memory 106 reads and writes, read requests and/or write requests are grouped together as part of a "burst" of requests for movement to the command queue 104. Thus, a group of read requests and/or a group of write requests may be executed consecutively.

In some embodiments, the memory management unit 102 determines that the staging buffer 112 is full. Accordingly, the memory management unit 102 stores a received memory access request directly in the command queue 104 without storing the received memory access request in the staging buffer 112.

Figure 2:
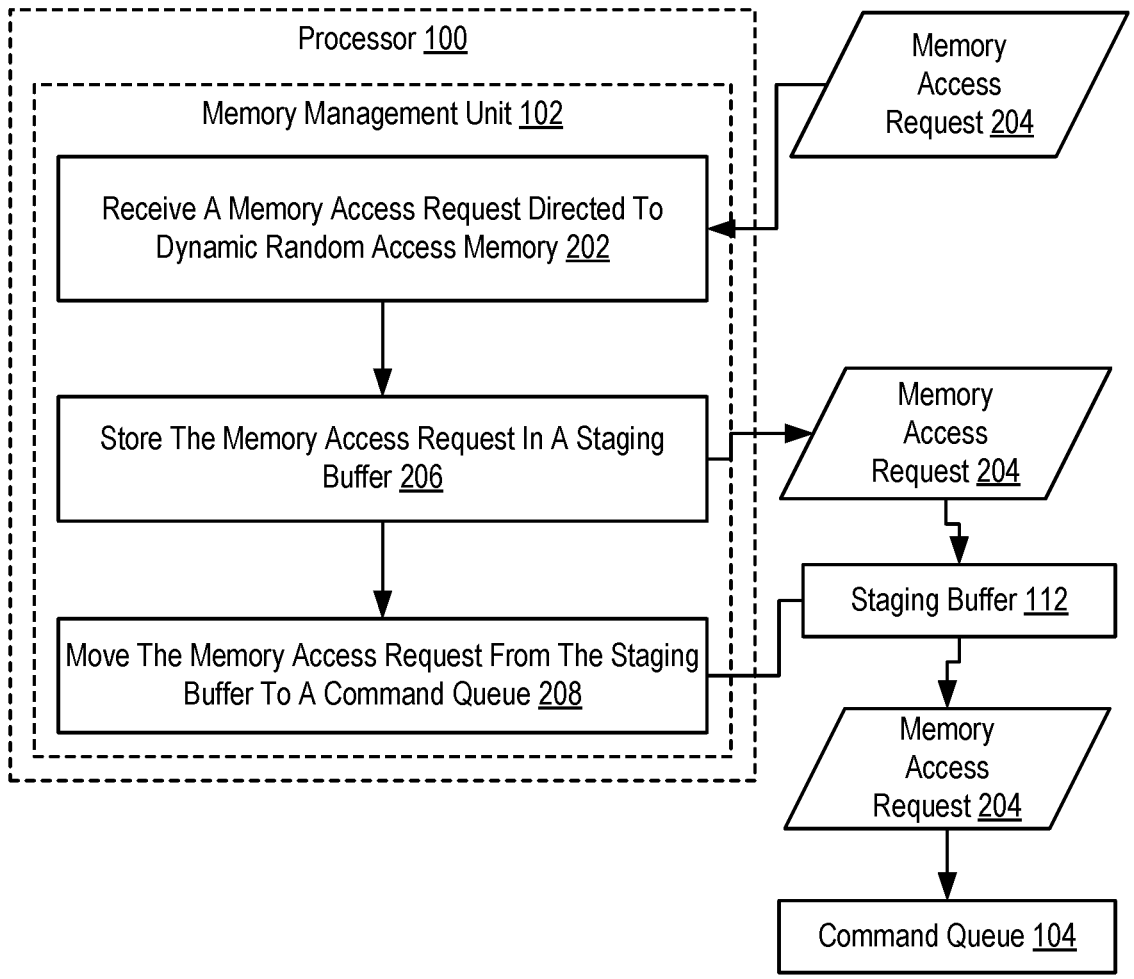
FIG. 2 is a flowchart of an example method for staging memory access requests according to some embodiments.

For further explanation, FIG. 2 sets forth a flow chart illustrating an exemplary method for staging memory access requests according to embodiments of the present disclosure that includes receiving 202 (e.g., by a memory management unit 102 of a processor 100) a memory access request 204 directed to Dynamic Random Access Memory 106. The memory access request 204 includes a request to read or write data to or from Dynamic Random Access Memory 106. The memory access request 204 is received via a data fabric or other interconnect coupling the memory management unit 102 to a central processing unit or other component.

The method of FIG. 2 also includes storing 206 (e.g., by the memory management unit 102) the memory access request 204 in a staging buffer 112. The method of FIG. 2 also includes moving 208 the memory access request 204 from the staging buffer 112 to a command queue 104. Moving 208 the memory access request 204 includes removing the memory access request 204 from the staging buffer 112 and storing the memory access request 204 in the command queue 104. In some embodiments, the memory access request 204 is moved in response to a number of memory access requests 204 in the staging buffer 112 meeting a threshold. In some embodiments, the memory access request 204 is moved in response to a number of memory access requests 204 in the command queue 104 falling below a threshold. In some embodiments, the memory access request 204 is moved in response to an age of the memory access request 204 (e.g., a time at which the memory access request 204 was received) meeting a threshold. In some embodiments the memory access request 204 is moved in response to one or more arbitration rules being satisfied.

Figure 3:
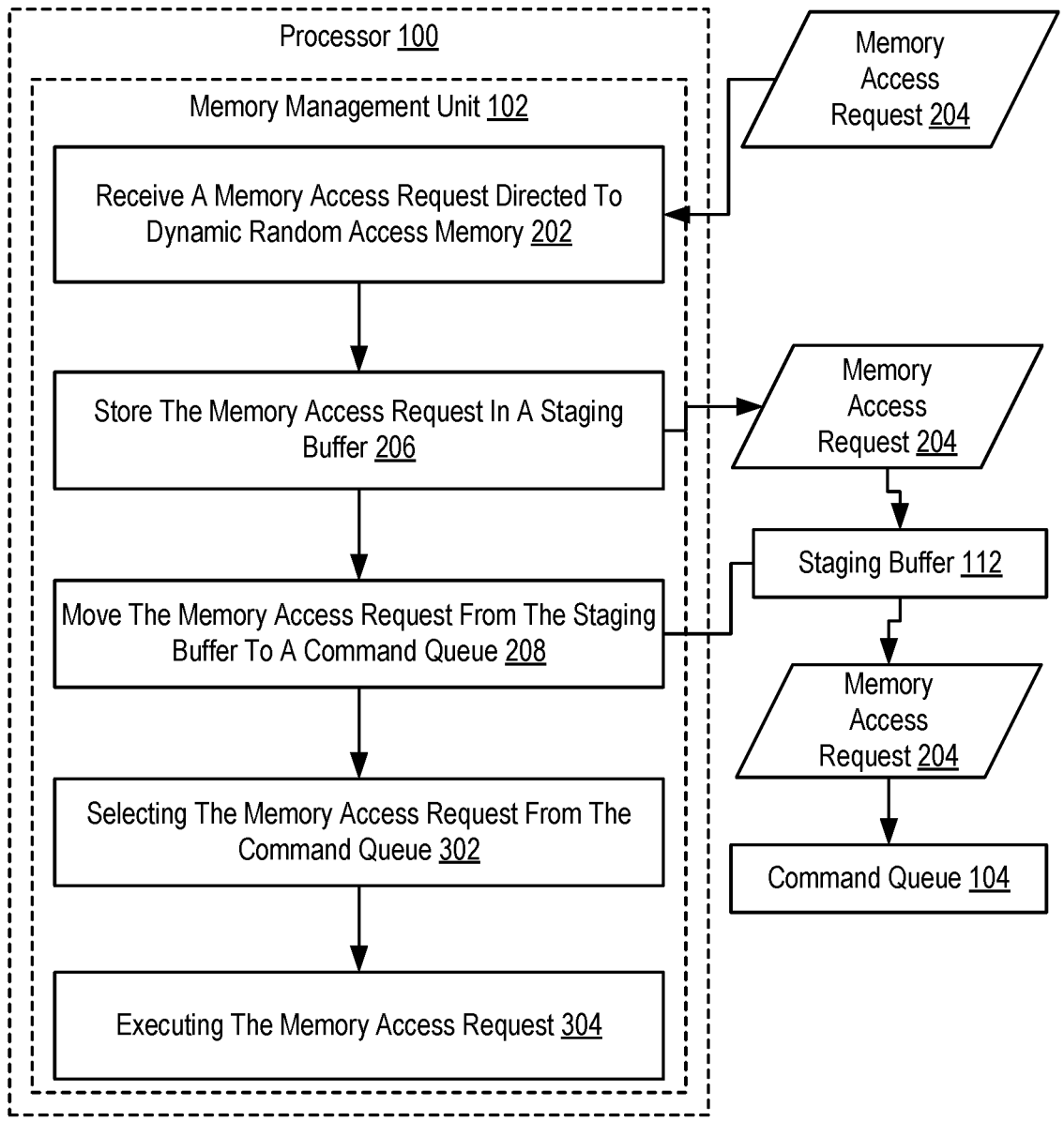
FIG. 3 is a flowchart of an example method for staging memory access requests according to some embodiments.

For further explanation, FIG. 3 sets forth a flow chart illustrating an exemplary method for staging memory access requests according to embodiments of the present disclosure that includes receiving 202 (e.g., by a memory management unit 102 of a processor 100) a memory access request 204 directed to Dynamic Random Access Memory 106; storing 206 the memory access request 204 in a staging buffer 112; and moving 208 the memory access request 204 from the staging buffer 112 to a command queue 104.

The method of FIG. 3 differs from FIG. 2 in that the method of FIG. 3 also includes selecting 302 (e.g., by the memory management unit 102 of the processor 100) the memory access request 204 from the command queue 104. The memory access request 204 is selected from the command queue 104 using one or more schemes, such as first-come-first-served (FCFS), first-ready, first-come-first-served (FR-FCFS), first-in-first-out (FIFO), etc. In some embodiments, the memory management unit 102 includes a command queue arbiter 108 that selects memory access requests from the command queue 104 for execution using one or more rules. For example, the one or more rules are based on timing or clock information (e.g., an age of a memory access request). As another example, the one or more rules are based on a page table 110. For example, memory access requests that will result in a page table 110 hit are preferentially selected from the command queue 104 for execution.

The method of FIG. 3 differs from FIG. 2 in that the method of FIG. 3 also includes executing 304 (e.g., by the memory management unit 102), the memory access request 204. Executing 304 the memory access request 204 includes reading data from a Dynamic Random Access Memory 106 address specified in the memory access request 204 and/or writing data to a Dynamic Random Access Memory 106 address specified in the memory access request 204.

Figure 4:
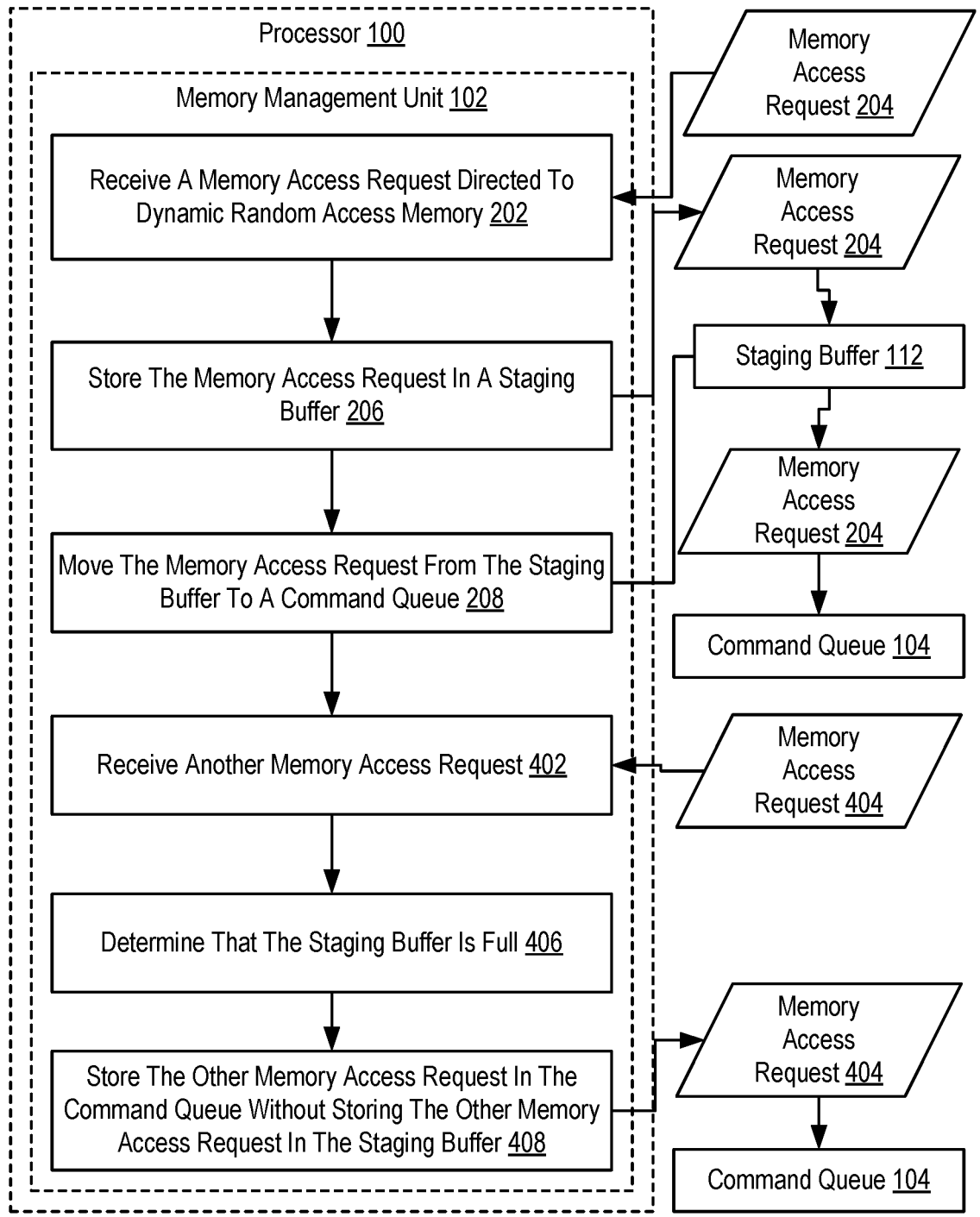
FIG. 4 is a flowchart of an example method for staging memory access requests according to some embodiments.

For further explanation, FIG. 4 sets forth a flow chart illustrating an exemplary method for staging memory access requests according to embodiments of the present disclosure that includes receiving 202 (e.g., by a memory management unit 102 of a processor 100) a memory access request 204 directed to Dynamic Random Access Memory 106; storing 206 the memory access request 204 in a staging buffer 112; and moving 208 the memory access request 204 from the staging buffer 112 to a command queue 104.

The method of FIG. 4 differs from FIG. 2 in that the method of FIG. 4 also includes receiving 402 another memory access request 404. The method of FIG. 4 further differs from FIG. 2 in that the method of FIG. 4 also includes determining 406 that the staging buffer 112 is full. The staging buffer 112 includes a predefined amount of memory for storing a predefined maximum number of memory access requests. Accordingly, determining 406 that the staging buffer 112 is full includes determining that the staging buffer 112 is storing the predefined maximum number of memory access requests.

The method of FIG. 4 further differs from FIG. 2 in that the method of FIG. 4 also includes storing 408 the other memory access request 404 in the command queue 104 without storing the other memory access request 404 in the staging buffer 112. Thus, the staging buffer 112 is bypassed when full.

Figure 5:
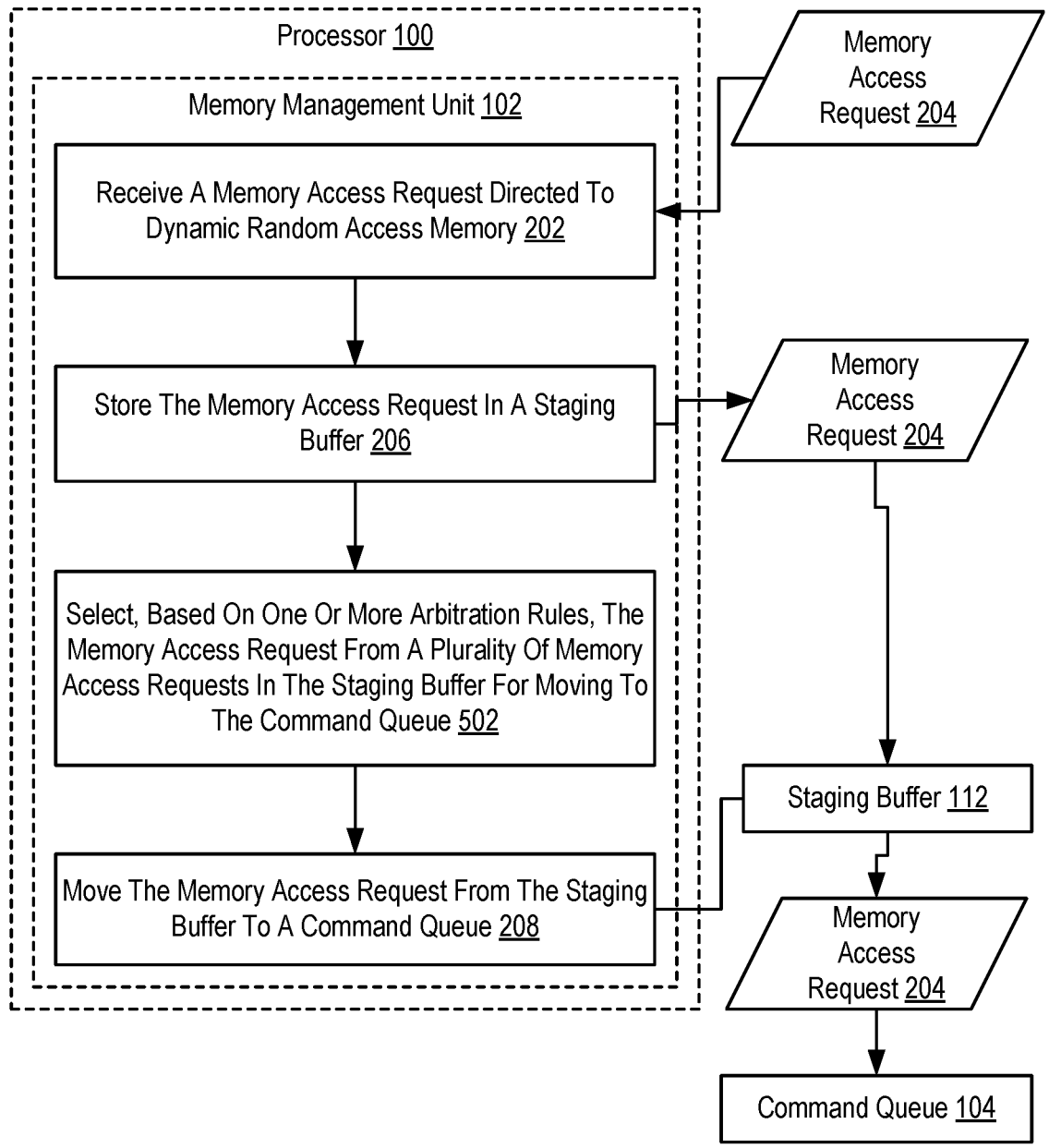
FIG. 5 is a flowchart of an example method for staging memory access requests according to some embodiments.

For further explanation, FIG. 5 sets forth a flow chart illustrating an exemplary method for staging memory access requests according to embodiments of the present disclosure that includes receiving 202 (e.g., by a memory management unit 102 of a processor 100) a memory access request 204 directed to Dynamic Random Access Memory 106; storing 206 the memory access request 204 in a staging buffer 112; and moving 208 the memory access request 204 from the staging buffer 112 to a command queue 104.

The method of FIG. 5 differs from FIG. 2 in that the method of FIG. 5 also includes selecting 502 (e.g., by the memory management unit 102, by a staging buffer arbiter 114 of the memory management unit 102), based on one or more arbitration rules, the memory access request 204 from a plurality of memory access requests in the staging buffer 112 for moving to the command queue 104.

In some embodiments, the arbitration rules are based on a Dynamic Random Access Memory 106 page targeted by a memory access request. For example, a memory access request targeting a Dynamic Random Access Memory 106 page that is open is preferentially selected for movement to the command queue 104 as overhead required in closing and opening pages is reduced. As another example, a memory access request targeting a Dynamic Random Access Memory 106 page that is also targeted by another memory access request in the command queue 104, and therefore will be open when the selected memory access request is executed, is preferentially selected.

In some embodiments, the arbitration rules are based on a bank group rotation or rank rotation. For example, where the Dynamic Random Access Memory 106 includes multiple banks, memory access requests are selected from the staging buffer 112 for addition to the command queue 104 such that consecutively added requests do not target a same bank. As an example, a memory access request targeting a first bank is moved to the command queue 104, then a memory access request targeting a second bank is moved to the command queue 104. Another memory access request targeting the first bank is then added to the command queue 104, etc. In some embodiments, memory access requests are selected to target different ranks within the same or different banks. Memory access requests are also selected to alternatively target different subchannels of Dynamic Random Access Memory 106 (e.g., sub-channel balancing).

In some embodiments, the arbitration rules are based on a request type for the memory access requests (e.g., read or write). As there is computational overhead in switching between Dynamic Random Access Memory 106 reads and writes, read requests and/or write requests are grouped together as part of a "burst" of requests for movement to the command queue 104. Thus, a group of read requests and/or a group of write requests are executed consecutively.

Figure 6:
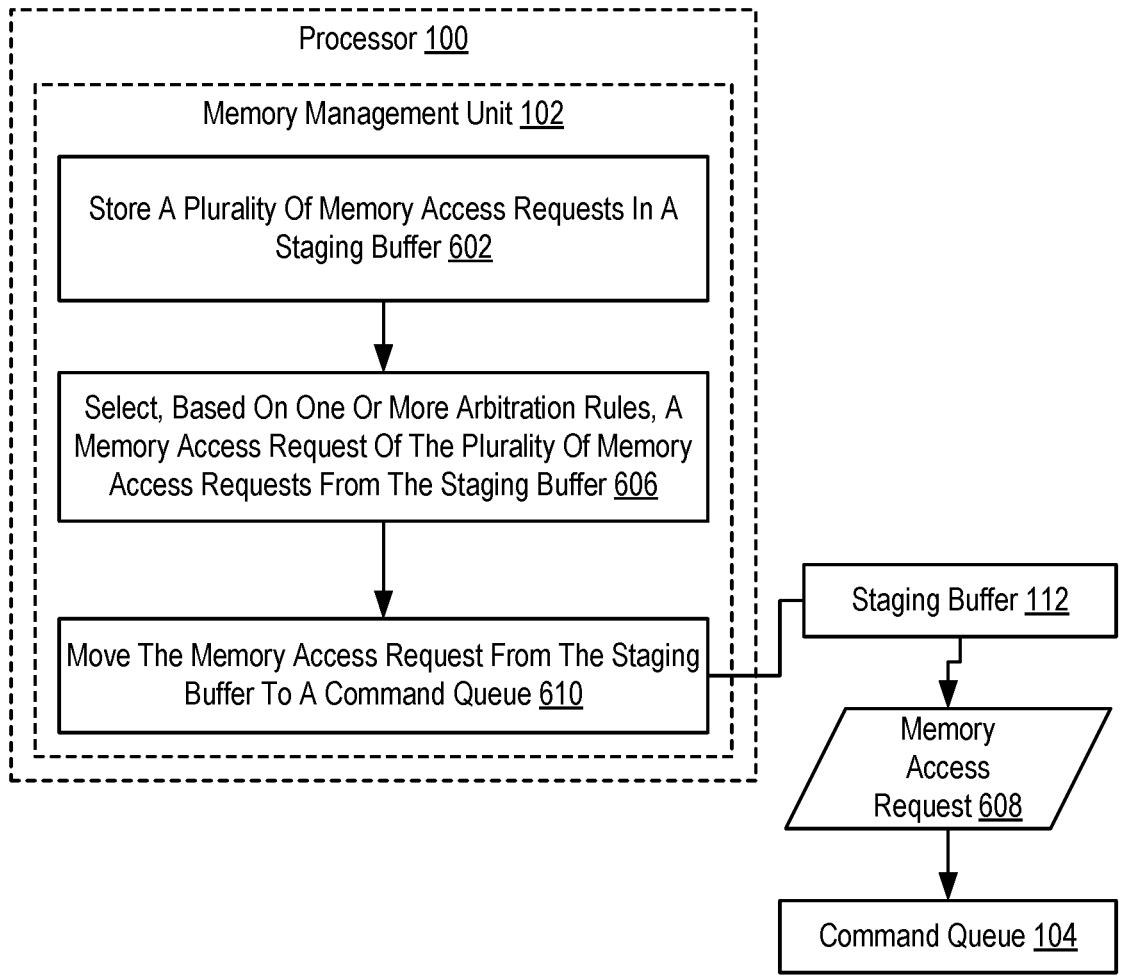
FIG. 6 is a flowchart of an example method for staging buffer arbitration according to some embodiments.

For further explanation, FIG. 6 sets forth a flow chart illustrating an exemplary method for staging buffer arbitration according to embodiments of the present disclosure that includes storing 602 (e.g., by a memory management unit 102 of a processor 100) a plurality of memory access requests in a staging buffer 112. The memory access requests include a request to read or write data to or from Dynamic Random Access Memory 106. The memory access requests are via a data fabric or other interconnect coupling the memory management unit 102 to a central processing unit or other component.

The method of FIG. 6 also includes selecting 606, based on one or more arbitration rules, a memory access request 608 of the plurality of memory access requests from the staging buffer 112. For example, a staging buffer arbiter 114 selects the memory access request 608 based on the one or more arbitration rules. The arbitration rules are applied to various attributes of the memory access requests stored in the staging buffer 112, memory access requests stored in a command queue 104, a page table 110, and/or other attributes. For example, the arbitration rules are based on request type of memory access requests in the staging buffer 112 and/or command queue 104, a currently open Dynamic Random Access Memory 106 page, bank groups targeted by the memory access requests in the staging buffer 112 and/or command queue 104, refresh state of a bank or page targeted by memory access requests in the staging buffer 112 and/or command queue 104, and/or sub-channels targeted by memory access requests in the staging buffer 112 and/or command queue 104.

The method of FIG. 6 also includes moving 610 the memory access request 608 from the staging buffer 112 to a command queue 104. Moving 610 the memory access request 608 includes deleting the memory access request 608 from the staging buffer 112 and/or freeing a portion of the staging buffer 112 storing the memory access request 608 for subsequent overwriting. Moving 610 the memory access request 608 also includes adding the memory access request 608 to the command queue 104. Thus, the memory access request 608 is later executed from the command queue 104 by the memory management unit 102.

Figure 7:
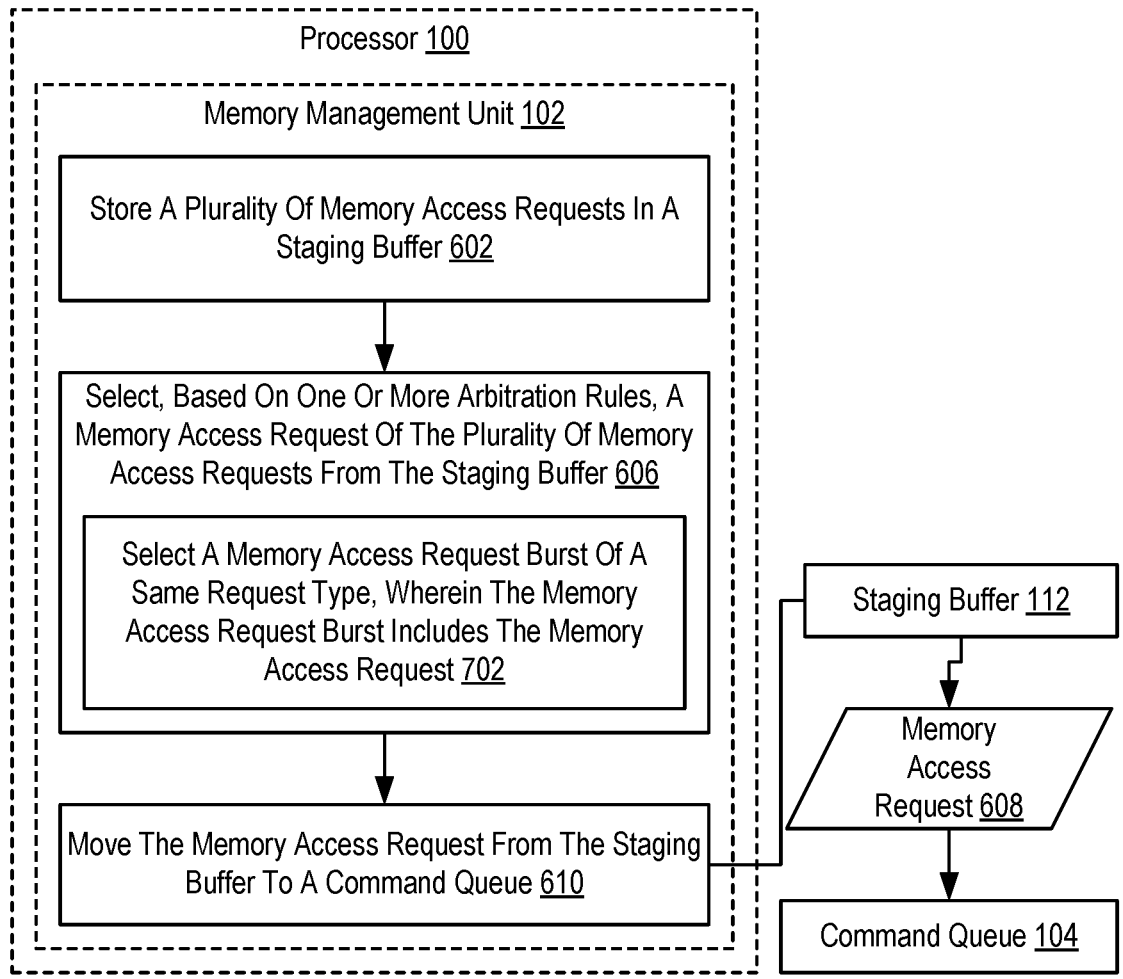
FIG. 7 is a flowchart of an example method for staging buffer arbitration according to some embodiments.

For further explanation, FIG. 7 sets forth a flow chart illustrating an exemplary method for staging buffer arbitration according to embodiments of the present disclosure that includes storing 602 (e.g., by a memory management unit 102 of a processor 100) a plurality of memory access requests in a staging buffer 112; selecting 606, based on one or more arbitration rules, a memory access request 608 of the plurality of memory access requests from the staging buffer 112; and moving 610 the memory access request 608 from the staging buffer 112 to a command queue 104.

The method of FIG. 7 differs from FIG. 6 in that selecting 606, based on one or more arbitration rules, a memory access request 608 of the plurality of memory access requests from the staging buffer 112 includes selecting 702 a memory access request burst of a same request type, wherein the memory access request burst includes the memory access request 608. A memory access request burst includes a plurality of memory access requests of the same type (e.g., read or write). The memory access requests in the memory access request burst are selected for movement to the command queue 104 consecutively and/or at least partially simultaneously such that the memory access requests in the memory access request burst are later executed consecutively and/or at least partially simultaneously. For example, a burst of read requests are executed without executing an intervening write request. As another example, a burst of write requests are executed without executing an intervening read request. As switching between executing read and write requests to Dynamic Random Access Memory 106 costs computational overhead, this computational overhead is avoided by executing multiple memory access requests of a same request type. Accordingly, the memory access request 608 is selected based on other memory access requests of the same request type having been added to the command queue 104 and or based on other memory access requests of the same request type being stored in the staging buffer 112 that are subsequently added to the command queue 104 as part of the memory access request burst.

Figure 8:
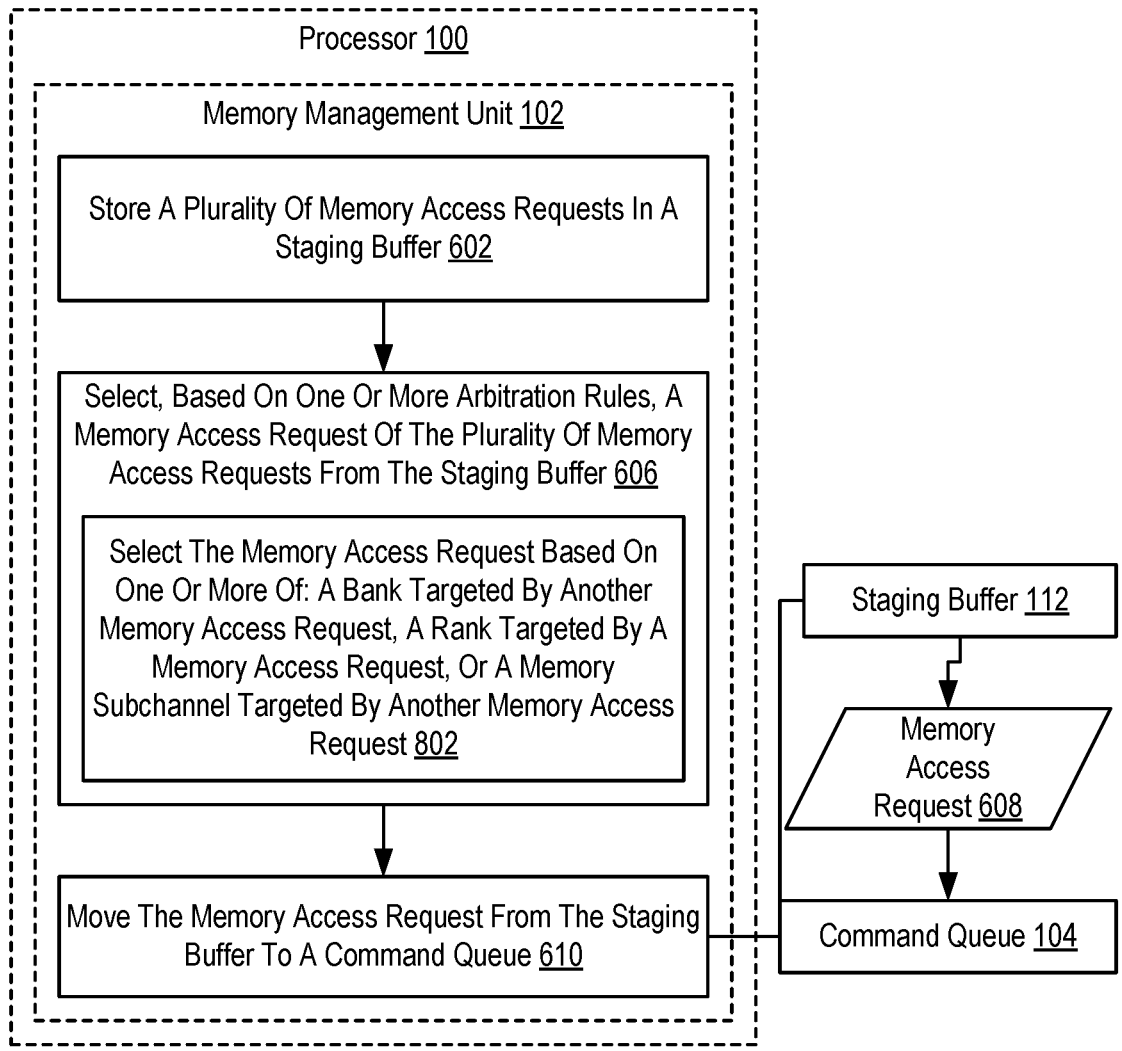
FIG. 8 is a flowchart of an example method for staging buffer arbitration according to some embodiments.

For further explanation, FIG. 8 sets forth a flow chart illustrating an exemplary method for staging buffer arbitration according to embodiments of the present disclosure that includes storing 602 (e.g., by a memory management unit 102 of a processor 100) a plurality of memory access requests in a staging buffer 112; selecting 606, based on one or more arbitration rules, a memory access request 608 of the plurality of memory access requests from the staging buffer 112; and moving 610 the memory access request 608 from the staging buffer 112 to a command queue 104.

The method of FIG. 8 differs from FIG. 6 in that selecting 606, based on one or more arbitration rules, a memory access request 608 of the plurality of memory access requests from the staging buffer 112 includes selecting 802 the memory access request 608 based on one or more of: a bank targeted by another memory access request, a rank targeted by a memory access request, or a memory subchannel targeted by another memory access request. For example, in some embodiments, memory access requests are added to the command queue 104 such that executed memory access requests alternatingly target different Dynamic Random Access Memory 106 ranks or banks (e.g., rank balancing, bank balancing). In other embodiments, memory access requests are added to the command queue 104 such that the executed memory access requests target Dynamic Random Access Memory 106 subchannels in a balanced approach. Accordingly, the memory access request 608 is selected based on a rank, bank, or subchannel targeted by a memory access request already added to the command queue 104 (e.g., a queued memory access command targeting a different rank, bank, or subchannel). The memory access request 608 is also selected based on a rank, bank, or subchannel targeted by a memory access request in the staging buffer 112 that is later added to the command queue 104 (e.g., a staged memory access command targeting a different rank, bank, or subchannel).

Figure 9:
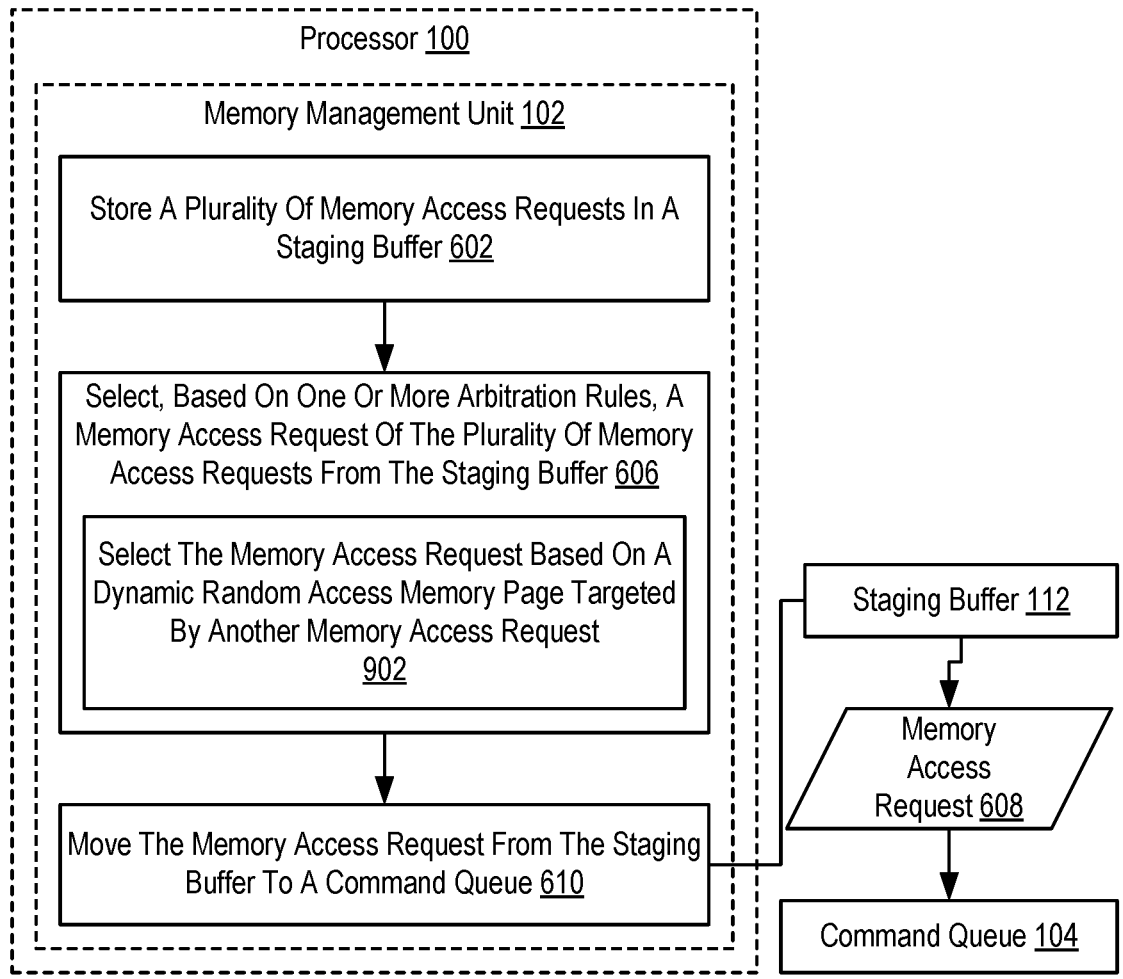
FIG. 9 is a flowchart of an example method for staging buffer arbitration according to some embodiments.

For further explanation, FIG. 9 sets forth a flow chart illustrating an exemplary method for staging buffer arbitration according to embodiments of the present disclosure that includes storing 602 (e.g., by a memory management unit 102 of a processor 100) a plurality of memory access requests in a staging buffer 112; selecting 606, based on one or more arbitration rules, a memory access request 608 of the plurality of memory access requests from the staging buffer 112; and moving 610 the memory access request 608 from the staging buffer 112 to a command queue 104.

The method of FIG. 9 differs from FIG. 6 in that selecting 606, based on one or more arbitration rules, a memory access request 608 of the plurality of memory access requests from the staging buffer 112 includes selecting 902 the memory access request 608 based on a Dynamic Random Access Memory 106 page targeted by another memory access request. If an executed memory access request targets a page that is not currently open, overhead occurs in closing the currently open page and opening the targeted page. Executing memory access requests targeting a same (e.g. open) page reduces this overhead. Accordingly, in some embodiments, the memory access request 608 is selected based on a page targeted by an already executed memory access request (e.g., an already open page). In some embodiments, the memory access request 608 is selected based on a page targeted by a memory access request stored in the command queue 104 to be executed prior to the selected memory access request 308 such that the targeted page will be open when the selected memory access request 608 is executed. In some embodiments, the memory access request 608 is selected based on a page targeted by another memory access request stored in the staging buffer 112 that will be subsequently selected for movement to the command queue 104 such that the targeted page is open when the other memory access request is executed.

Figure 10:
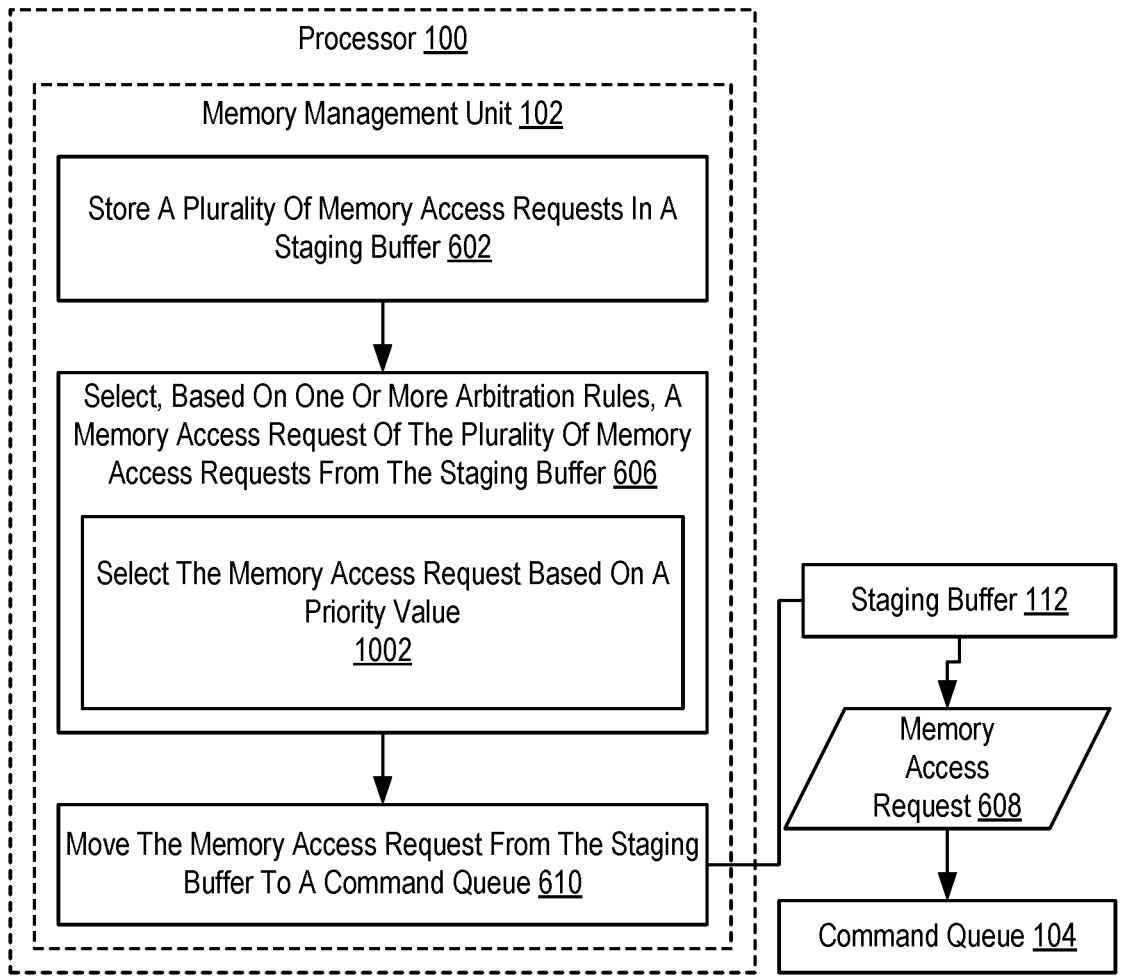
FIG. 10 is a flowchart of an example method for staging buffer arbitration according to some embodiments.

For further explanation, FIG. 10 sets forth a flow chart illustrating an exemplary method for staging buffer arbitration according to embodiments of the present disclosure that includes storing 602 (e.g., by a memory management unit 102 of a processor 100) a plurality of memory access requests in a staging buffer 112; selecting 606, based on one or more arbitration rules, a memory access request 608 of the plurality of memory access requests from the staging buffer 112; and moving 610 the memory access request 608 from the staging buffer 112 to a command queue 104.

The method of FIG. 10 differs from FIG. 6 in that selecting 606, based on one or more arbitration rules, a memory access request 608 of the plurality of memory access requests from the staging buffer 112 includes selecting 1002 the memory access request 1002 based on a priority value. In some embodiments, the priority value is an explicit priority value assigned to memory access requests 608 (e.g., a priority tier). In other embodiments, the priority value is calculated based on an attribute of memory access requests, such as an age of the memory access requests (e.g., a time at which a given memory access request was generated or received by the memory management unit 102).

Figure 11:
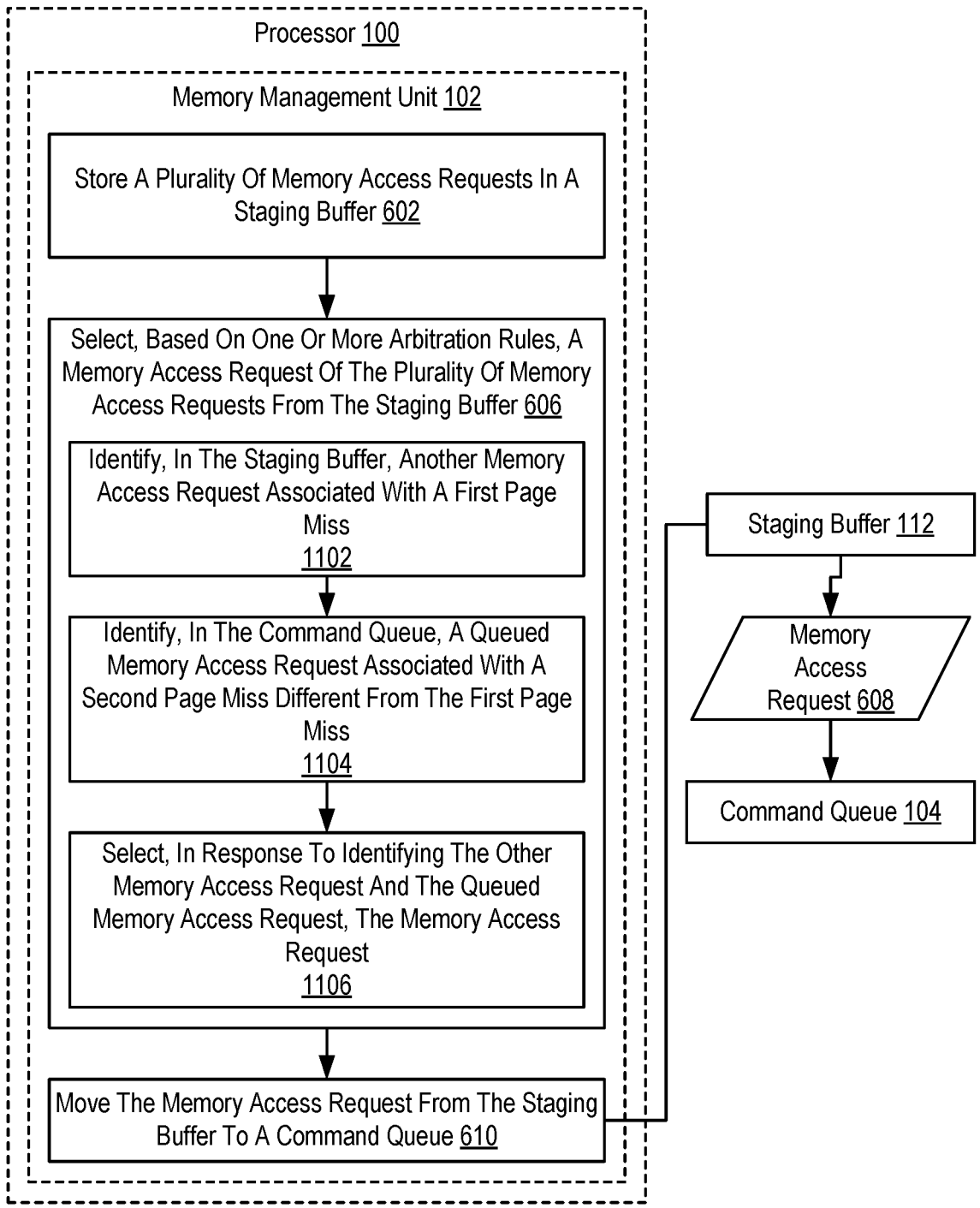
FIG. 11 is a flowchart of an example method for staging buffer arbitration according to some embodiments.

For further explanation, FIG. 11 sets forth a flow chart illustrating an exemplary method for staging buffer arbitration according to embodiments of the present disclosure that includes storing 602 (e.g., by a memory management unit 102 of a processor 100) a plurality of memory access requests in a staging buffer 112; selecting 606, based on one or more arbitration rules, a memory access request 608 of the plurality of memory access requests from the staging buffer 112; and moving 610 the memory access request 608 from the staging buffer 112 to a command queue 104.

The method of FIG. 11 differs from FIG. 6 in that selecting 606, based on one or more arbitration rules, a memory access request 608 of the plurality of memory access requests from the staging buffer 112 includes identifying 1102, in the staging buffer 112, another memory access request associated with a first page miss. In other words, execution of the other memory access request will result in a page miss and corresponding computational overhead. For example, the page table 110 is accessed to determine that execution of the other memory access request will result in a page miss.

The method of FIG. 11 further differs from FIG. 6 in that selecting 606, based on one or more arbitration rules, a memory access request 608 of the plurality of memory access requests from the staging buffer 112 also includes identifying 1104, in the command queue 104, a queued memory access request associated with a second page miss different from the first page miss. For example, the queued memory access request is identified as having a same request type and targeting a same Dynamic Random Access Memory bank as the other memory access request in the staging buffer, but will result in a different row page miss.

The method of FIG. 11 further differs from FIG. 6 in that selecting 606, based on one or more arbitration rules, a memory access request 608 of the plurality of memory access requests from the staging buffer 112 also includes selecting 1106, in response to identifying the other memory access request and the queued memory access request, the memory access request 608. In other words, the memory access request 608 is preferentially selected over the other memory access request in the staging buffer 112 associated with the first page miss.

Figure 12:
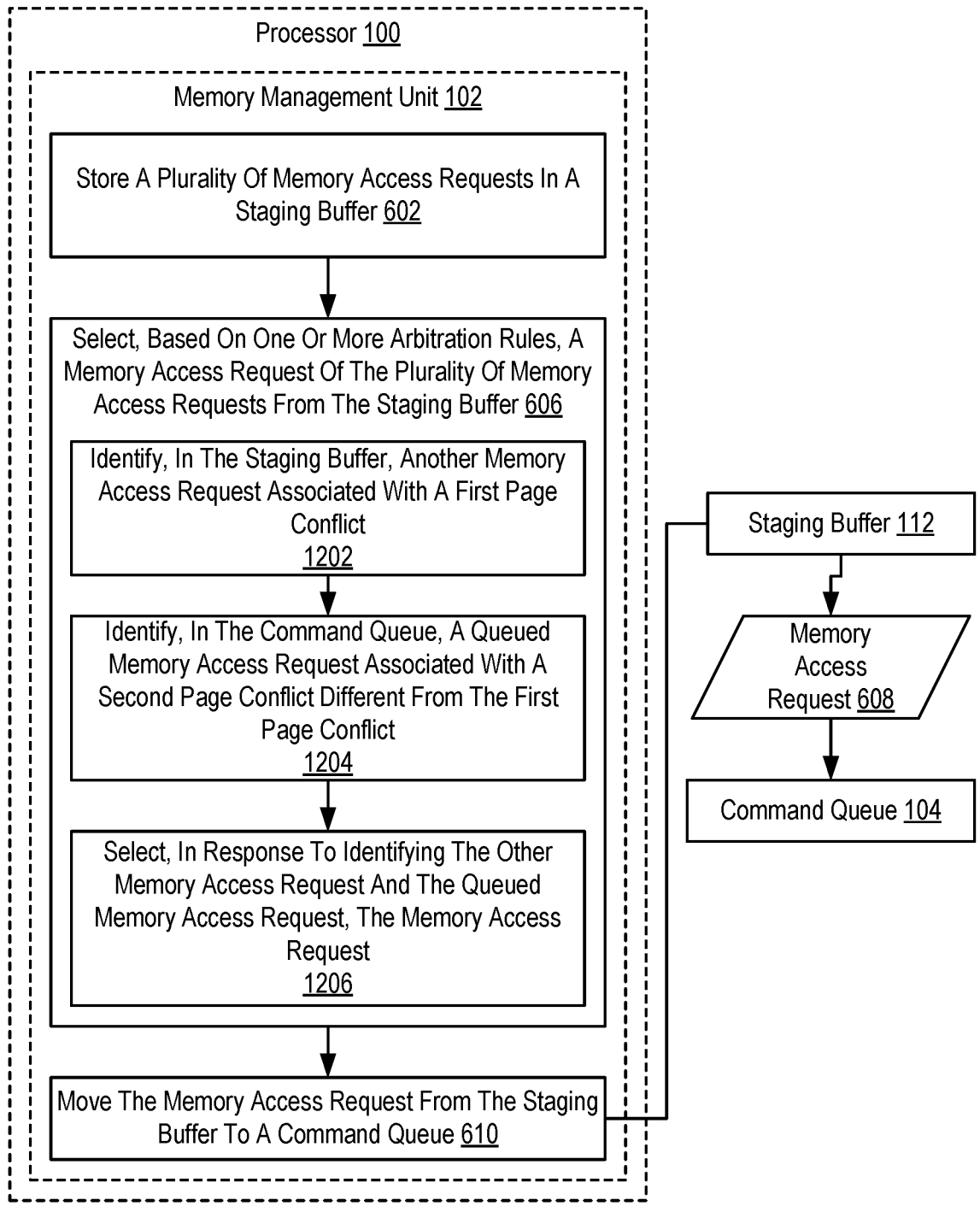
FIG. 12 is a flowchart of an example method for staging buffer arbitration according to some embodiments.

For further explanation, FIG. 12 sets forth a flow chart illustrating an exemplary method for staging buffer arbitration according to embodiments of the present disclosure that includes storing 602 (e.g., by a memory management unit 102 of a processor 100) a plurality of memory access requests in a staging buffer 112; selecting 606, based on one or more arbitration rules, a memory access request 608 of the plurality of memory access requests from the staging buffer 112; and moving 610 the memory access request 608 from the staging buffer 112 to a command queue 104.

The method of FIG. 12 differs from FIG. 6 in that selecting 606, based on one or more arbitration rules, a memory access request 608 of the plurality of memory access requests from the staging buffer 112 includes identifying 1202, in the staging buffer 112, another memory access request associated with a first page conflict. In other words, execution of the other memory access request will result in a page conflict and corresponding computational overhead. For example, the page table 110 is accessed to determine that execution of the other memory access request will result in a page conflict.

The method of FIG. 12 further differs from FIG. 6 in that selecting 606, based on one or more arbitration rules, a memory access request 608 of the plurality of memory access requests from the staging buffer 112 also includes identifying 1204, in the command queue 104, a queued memory access request associated with a second page conflict different from the first page conflict. For example, the queued memory access request is identified as having a same request type and targeting a same Dynamic Random Access Memory bank as the other memory access request in the staging buffer 112, but will result in a different row page conflict.

The method of FIG. 12 further differs from FIG. 6 in that selecting 606, based on one or more arbitration rules, a memory access request 608 of the plurality of memory access requests from the staging buffer 112 also includes selecting 1206, in response to identifying the other memory access request and the queued memory access request, the memory access request 608. In other words, the memory access request 608 is preferentially selected over the other memory access request in the staging buffer 112 associated with the first page conflict.

Figure 13:
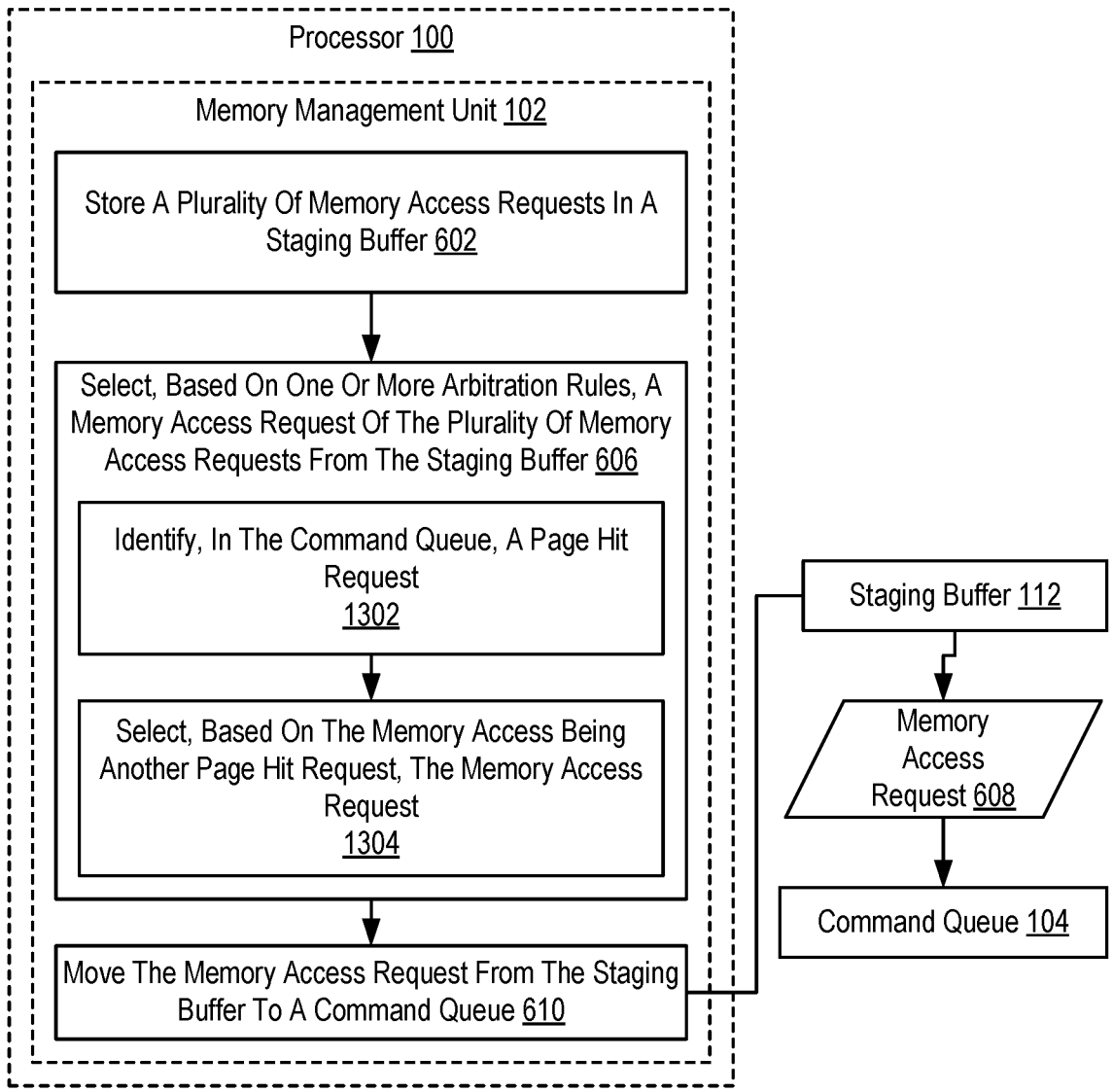
FIG. 13 is a flowchart of an example method for staging buffer arbitration according to some embodiments.

For further explanation, FIG. 13 sets forth a flow chart illustrating an exemplary method for staging memory access requests according to embodiments of the present disclosure that includes storing 602 (e.g., by a memory management unit 102 of a processor 100) a plurality of memory access requests in a staging buffer 112; selecting 606, based on one or more arbitration rules, a memory access request 608 of the plurality of memory access requests from the staging buffer 112; and moving 610 the memory access request 608 from the staging buffer 112 to a command queue 104.

The method of FIG. 13 differs from FIG. 6 in that selecting 606, based on one or more arbitration rules, a memory access request 608 of the plurality of memory access requests from the staging buffer 112 includes identifying 1302, in the command queue 104, a page hit request. A page hit request includes a memory access request targeting a currently open page of dynamic random access memory 106. The method of FIG. 13 further differs from FIG. 6 in that selecting 606, based on one or more arbitration rules, a memory access request 608 of the plurality of memory access requests from the staging buffer 112 includes selecting 1304, based on the memory access request 608 being another page hit request, the memory access request 608. In other words, the memory access request 608 is preferentially selected for movement to the command queue 104 over other memory access requests that would result in a page miss. Thus, the staging buffer 112 will hold page conflict requests. In some implementations, the memory access request 608 is selected for movement to the command queue 104 such that the command queue 104 preferentially holds no more than one memory access request for each bank.

In view of the explanations set forth above, readers will recognize that the benefits of staging memory access requests according to embodiments of the present disclosure include:

Improved performance of a computing system by relieving command queue pressure through the use of an additional staging buffer.

Improved performance of a computing system by optimally selecting memory access requests for addition to the command queue to reduce computational overhead.

Exemplary embodiments of the present disclosure are described largely in the context of a fully functional computer system for staging memory access requests. Readers of skill in the art will recognize, however, that the present disclosure also can be embodied in a computer program product disposed upon computer readable storage media for use with any suitable data processing system. Such computer readable storage media can be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the disclosure as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present disclosure.

The present disclosure can be a system, a method, and/or a computer program product. The computer program product can include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes can be made in various embodiments of the present disclosure. The descriptions in this specification are for purposes of illustration only and are not to be construed in a limiting sense. The scope of the present disclosure is limited only by the language of the following claims.

What is claimed is:

1. A method of staging memory access requests, the method comprising:
   selecting, by a memory management unit, between a first memory access request and a second memory access request, from a plurality of memory access requests stored in a staging buffer, for moving to a command queue of the memory management unit, in response to a request type of the selected memory access request in the staging buffer being a same request type as a third memory access request in the command queue;
   moving, by the memory management unit, the selected memory access request from the staging buffer to the command queue;
   receiving another memory access request;
   determining that the staging buffer is full; and
   storing the other memory access request in the command queue without storing the other memory access request in the staging buffer based on the determining that the staging buffer is full.

2. The method of claim 1, further comprising:
   selecting, from the command queue by a command queue arbiter, the memory access request moved to the command queue, wherein selecting by the command queue arbiter is based on one or more of a page table and an age of the memory access request moved to the command queue; and
   executing the memory access request selected from the command queue.

3. The method of claim 1, wherein selecting between the first memory access request and the second memory access request is based on an open Dynamic Random Access Memory page.

4. The method of claim 1, wherein selecting between the first memory access request and the second memory access request is based on a bank group rotation.

5. The method of claim 1, wherein selecting between the first memory access request and the second memory access request is based on a sub-channel balancing.

6. The method of claim 1, wherein moving the selected memory access request from the staging buffer to the command queue is in response to a number of the plurality of memory access requests in the staging buffer meeting a threshold.

7. A memory management unit comprising:
   a command queue;
   a staging buffer;
   a staging buffer arbiter configured to:
      select between a first memory access request and a second memory access request, from a plurality of memory access requests in the staging buffer, for moving to the command queue, in response to a request type of the selected memory access request in the staging buffer being a same request type as a third memory access request in the command queue; and
      move the selected memory access request from the staging buffer to the command queue; and
   logic to:
      receive another memory access request; and
      store the other memory access request in the command queue without storing the other memory access request in the staging buffer responsive to the staging buffer is full.

8. The memory management unit of claim 7, further comprising a command queue arbiter to:
   select, from the command queue, the memory access request moved to the command queue, wherein selecting by the command queue arbiter is based on one or more of a page table and an age of the memory access request moved to the command queue; and
   execute the memory access request selected from the command queue.

9. The memory management unit of claim 7, wherein the staging buffer arbiter is further configured to select between the first memory access request and the second memory access request based an open Dynamic Random Access Memory page.

10. The memory management unit of claim 7, wherein the staging buffer arbiter is further configured to select between the first memory access request and the second memory access request based on a bank group rotation.

11. The memory management unit of claim 7, wherein the staging buffer arbiter is further configured to select between the first memory access request and the second memory access request based on a sub-channel balancing.

12. The memory management unit of claim 7, wherein moving the selected memory access request from the staging buffer to the command queue is in response to a number of the plurality of memory access requests in the staging buffer meeting a threshold.

13. A system comprising:
   a processor and Dynamic Random Access Memory, wherein the processor is coupled to the Dynamic Random Access Memory through a memory management unit and the memory management unit is configured to:
      select between a first memory access request and a second memory access request, from a plurality of memory access requests in a staging buffer, for moving to a command queue, in response to a request type of the selected memory access request in the staging buffer being a same request type as a third memory access request in the command queue;

move the selected memory access request from the staging buffer to the command queue;

receive another memory access request; and store the other memory access request in the command queue without storing the other memory access request in the staging buffer responsive to the staging buffer being full.

14. The system of claim 13, wherein the memory management unit is further configured to:

select, from the command queue by a command queue arbiter of the memory management unit, the memory access request moved to the command queue, wherein selecting by the command queue arbiter is based on one or more of a page table and an age of the memory access request moved to the command queue; and execute the memory access request selected from the command queue.

15. The system of claim 13, wherein the memory management unit is further configured to select between the first memory access request and the second memory access request based on an open Dynamic Random Access Memory page.

16. The system of claim 13, wherein the memory management unit is further configured to select between the first memory access request and the second memory access request based on a bank group rotation.

17. The system of claim 13, wherein the memory management unit is further configured to select between the first memory access request and the second memory access request based on a sub-channel balancing.

18. The system of claim 13, wherein moving the selected memory access request from the staging buffer to the command queue is in response to a number of the plurality of memory access requests in the staging buffer meeting a threshold.

* * * * *